(12) United States Patent
Lee et al.

(10) Patent No.: US 12,538,412 B2
(45) Date of Patent: Jan. 27, 2026

(54) ELECTRONIC DEVICE INCLUDING SHIELDING MEMBER INCLUDING STRUCTURE FOR REDUCING DEFORMATION

(71) Applicant: Samsung Electronics Co., Ltd., Suwon-si (KR)

(72) Inventors: Jeongseok Lee, Suwon-si (KR); Hyein Park, Suwon-si (KR); Jaedeok Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 181 days.

(21) Appl. No.: 18/432,920

(22) Filed: Feb. 5, 2024

(65) Prior Publication Data

US 2024/0224410 A1 Jul. 4, 2024

Related U.S. Application Data

(63) Continuation of application No. PCT/KR2023/020025, filed on Dec. 6, 2023.

(30) Foreign Application Priority Data

Jan. 2, 2023 (KR) .................. 10-2023-0000371
Jan. 17, 2023 (KR) .................. 10-2023-0006800

(51) Int. Cl.
H05K 1/02 (2006.01)

(52) U.S. Cl.
CPC ......... *H05K 1/0218* (2013.01); *H05K 1/0215* (2013.01); *H05K 2201/0112* (2013.01);
(Continued)

(58) Field of Classification Search
CPC ............... H05K 1/0218; H05K 1/0215; H05K 2201/0112; H05K 2201/0707
(Continued)

(56) References Cited

U.S. PATENT DOCUMENTS 6,353,540 B1  3/2002 Akiba et al.
9,645,431 B2  5/2017 Chang et al.
(Continued)

FOREIGN PATENT DOCUMENTS

CN   112980034 A   6/2021
CN   114566488 A   5/2022
(Continued)

OTHER PUBLICATIONS

International Search Report dated Mar. 27, 2024, issued in International Application No. PCT/KR2023/020025.

*Primary Examiner* — Binh B Tran
(74) *Attorney, Agent, or Firm* — Jefferson IP Law, LLP

(57) ABSTRACT

An electronic device according to an embodiment includes a printed circuit board including a ground pad, an optical sensor disposed on the printed circuit board, and a shielding member covering the optical sensor. The shielding member includes a first adhesive layer attached on the optical sensor and the ground pad, a first shielding layer electrically connected to the ground pad and disposed on the first adhesive layer, and a first cover layer disposed on the first shielding layer, the first cover layer including a plurality of first particles configured to reflect or scatter light, a plurality of second particles configured to absorb the light, and a binder covering the plurality of first particles and the plurality of second particles.

20 Claims, 7 Drawing Sheets

(52) U.S. Cl.
 CPC ............... *H05K 2201/0707* (2013.01); *H05K 2201/10151* (2013.01); *H05K 2201/2054* (2013.01)

(58) Field of Classification Search
 USPC ........................................................ 361/748
 See application file for complete search history.

(56) References Cited

U.S. PATENT DOCUMENTS

| | | | |
|---|---|---|---|
| 10,410,974 B2* | 9/2019 | Min | H01L 23/295 |
| 11,291,144 B2* | 3/2022 | Lee | H05K 9/0031 |
| 11,333,953 B2 | 5/2022 | Song et al. | |
| 11,369,051 B2 | 6/2022 | Kim et al. | |
| 2017/0318713 A1* | 11/2017 | Bang | H05K 9/0088 |
| 2020/0251458 A1 | 8/2020 | Tsai et al. | |
| 2021/0242137 A1 | 8/2021 | Matsudo et al. | |

FOREIGN PATENT DOCUMENTS

| | | |
|---|---|---|
| KR | 10-1160589 B1 | 6/2012 |
| KR | 10-1326725 B1 | 11/2013 |
| KR | 10-2016-0025988 A | 3/2016 |
| KR | 10-2017-0123747 A | 11/2017 |
| KR | 10-1842253 B1 | 3/2018 |
| KR | 10-2311989 B1 | 10/2021 |
| KR | 10-2021-0141036 A | 11/2021 |
| KR | 10-2022-0100396 A | 7/2022 |
| KR | 10-2419046 B1 | 7/2022 |
| KR | 10-2023-0140300 A | 10/2023 |
| KR | 10-2662052 B1 | 5/2024 |

\* cited by examiner

ELECTRONIC DEVICE INCLUDING SHIELDING MEMBER INCLUDING STRUCTURE FOR REDUCING DEFORMATION

CROSS-REFERENCE TO RELATED APPLICATION(S)

This application is a continuation application, claiming priority under § 365(c), of an International application No. PCT/KR2023/020025, filed on Dec. 6, 2023, which is based on and claims the benefit of a Korean patent application number 10-2023-0000371, filed on Jan. 2, 2023, in the Korean Intellectual Property Office, and of a Korean patent application number 10-2023-0006800, filed on Jan. 17, 2023, in the Korean Intellectual Property Office, the disclosure of each of which is incorporated by reference herein in its entirety.

BACKGROUND

1. Field

The present disclosure relates to an electronic device including a shielding member having a structure for reducing deformation.

2. Description of Related Art

Electronic devices may be miniaturized to meet the needs of users. As the electronic devices are miniaturized, a space in which electronic components in an electronic device are mounted may decrease. As the space in which the electronic components are mounted is reduced, a distance between the electronic components in the electronic device may be reduced. As the distance between the electronic components decreases, electromagnetic waves generated from the electronic components may cause performance degradation of other electronic components. Electronic components may be covered up by a shielding member to shield the electromagnetic waves generated.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including a shielding member having a structure for reducing deformation.

Additional aspects will be set forth in part in the description which follows and, in part, will be apparent from the description, or may be learned by practice of the presented embodiments.

According to an embodiment, an electronic device may comprise a printed circuit board (PCB) including a ground pad. According to an embodiment, the electronic device may comprise an optical sensor disposed on the printed circuit board. According to an embodiment, the electronic device may comprise a shielding member covering the optical sensor. According to an embodiment, the shielding member may include a first adhesive layer attached on the optical sensor and the ground pad. According to an embodiment, the shielding member may include a first shielding layer electrically connected to the ground pad, and disposed on the first adhesive layer. According to an embodiment, the shielding member may include a first cover layer disposed on the first shielding layer, and including a plurality of first particles configured to reflect or scatter light, a plurality of second particles configured to absorb the light, and a binder covering the plurality of first particles and the plurality of second particles.

According to an embodiment, an electronic device may comprise a housing including one surface supporting a display, and another surface opposite to the one surface. According to an embodiment, the electronic device may comprise a printed circuit board (PCB) including a ground pad and disposed in the housing. According to an embodiment, the electronic device may comprise an optical sensor disposed on the PCB and including a light emitting unit configured to emit light toward the another surface of the housing, and a light receiving unit configured to receive light from an object outside the electronic device. According to an embodiment, the electronic device may comprise a shielding member covering the optical sensor and at least a portion of the PCB. According to an embodiment, the shielding member may include a first adhesive layer attached on the optical sensor and the ground pad. According to an embodiment, the shielding member may include a first shielding layer electrically connected to the ground pad and disposed on the first adhesive layer. According to an embodiment, the shielding member may include a first cover layer disposed on the first shielding layer, and including a plurality of first particles configured to reflect or scatter light emitted from the light emitting unit and then reflected inside of the housing after being emitted from the light emitting unit, a plurality of second particles configured to absorb the light reflected inside of the housing after being emitted from the light emitting unit, and a binder defining a mixture together with the plurality of first particles and the plurality of second particles by covering the plurality of first particles and the plurality of second particles.

Other aspects, advantages, and salient features of the disclosure will become apparent to those skilled in the art from the following detailed description, which, taken in conjunction with the annexed drawings, discloses various embodiments of the disclosure.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a Wi-Fi chip, a Bluetooth® chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an integrated circuit (IC), or the like.

Figure 1:
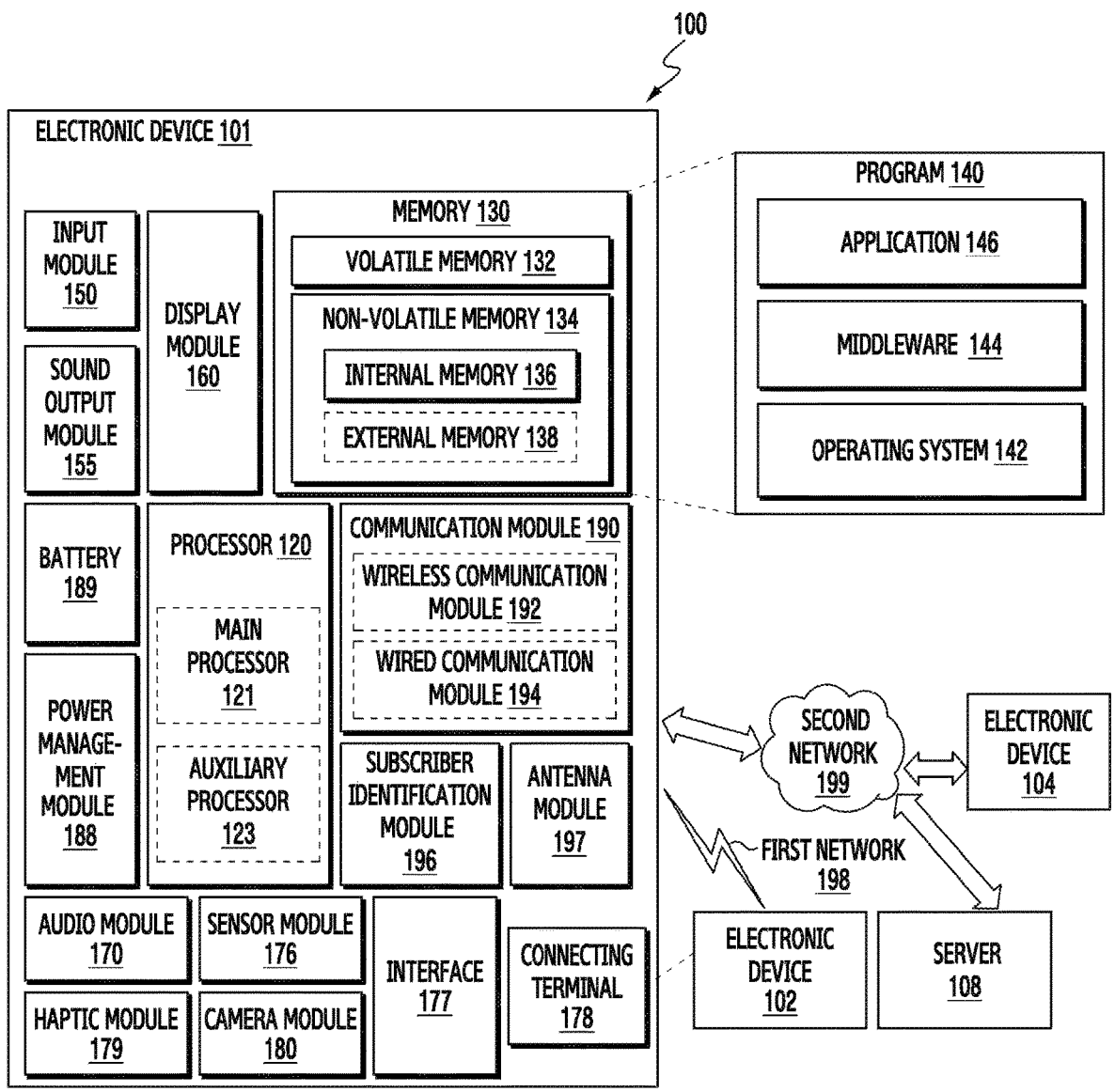
FIG. 1 is a block diagram illustrating an electronic device in a network environment according to various embodiments.

FIG. 1 is a block diagram of an electronic device in a network environment according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mm Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of lms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mm Wave antenna module. According to an embodiment, the mm Wave antenna module may include a printed circuit board, an RFIC disposed on a first surface (e.g., the bottom surface) of the printed circuit board, or adjacent to the first surface and capable of supporting a designated high-frequency band (e.g., the mm Wave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IOT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
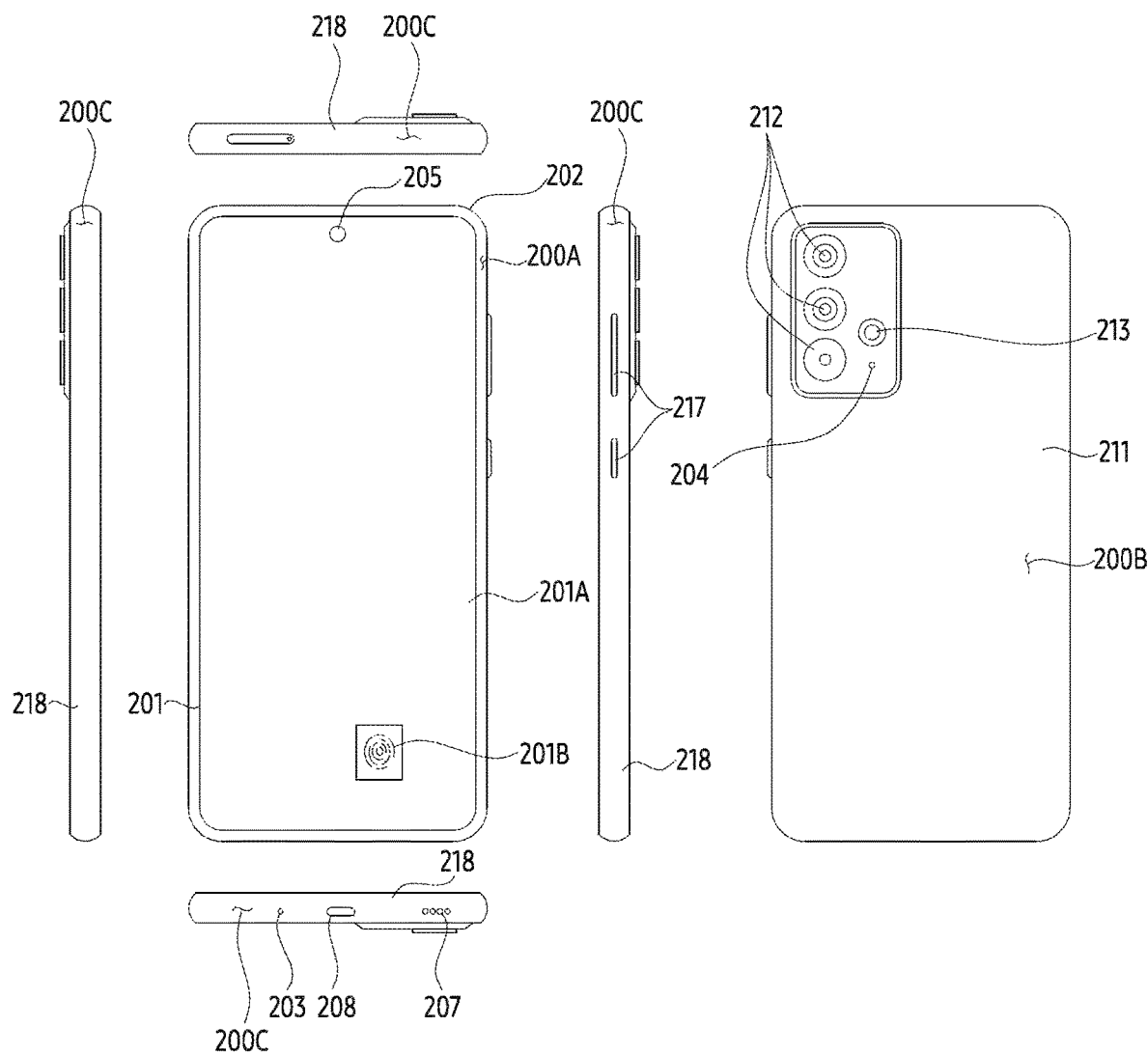
FIG. 2 is a diagram illustrating an example electronic device according to an embodiment.

FIG. 2 is a diagram illustrating an electronic device according to an embodiment.

Referring to FIG. 2, an electronic device 200 (e.g., the electronic device 101 of FIG. 1) according to an embodiment may include a housing 230 forming an outer appearance of the electronic device 200. For example, the housing 230 may include a first surface (or front surface) 200A, a second surface (or rear surface) 200B, and a third surface (or side surface) 200C surrounding a space defined between the first surface 200A and the second surface 200B. In an embodiment, the housing 230 may refer to a structure (e.g., a frame structure 240 of FIG. 3) that forms at least a part of the first surface 200A, the second surface 200B, and/or the third surface 200C.

The electronic device 200 according to an embodiment may include a substantially transparent front plate 202. In an embodiment, the front plate 202 may form at least a portion of the first surface 200A. In an embodiment, the front plate 202 may include, for example, a glass plate or a polymer plate including various coating layers, but it is not limited thereto.

The electronic device 200 according to an embodiment may include a rear plate 211 that is substantially opaque. In an embodiment, the rear plate 211 may form at least a portion of the second surface 200B. In an embodiment, the rear plate 211 may be formed of coated or colored glass, ceramic, polymer, metal (e.g., aluminum, stainless steel (STS), or magnesium), or a combination of at least two of those materials.

Figure 3:
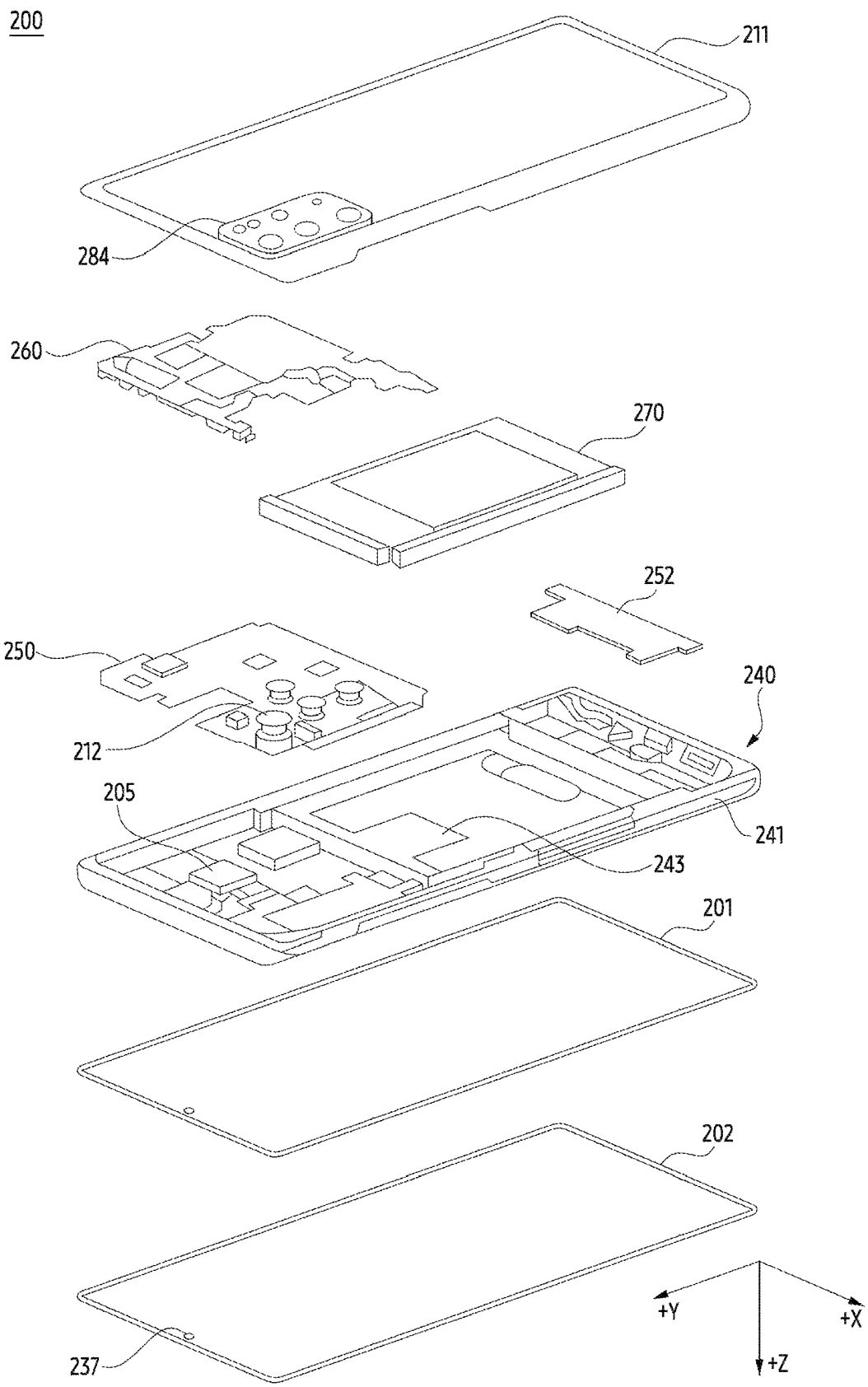
FIG. 3 is an exploded perspective view of an example electronic device according to an embodiment.

The electronic device 200 according to an embodiment may include a side bezel structure (or a side member) 218 (e.g., a sidewall 241 of a frame structure 240 of FIG. 3). In an embodiment, the side bezel structure 218 may be coupled to the front plate 202 and/or the rear plate 211 to form at least a portion of the third surface 200C of the electronic device 200. For example, the side bezel structure 218 may form the entire third surface 200C of the electronic device 200, and as another example, the side bezel structure 218 may form the third surface 200C of the electronic device 200 together with the front plate 202 and/or the rear plate 211.

Unlike the illustrated embodiment, when the third surface 200C of the electronic device 200 is partially formed by the front plate 202 and/or the rear plate 211, the front plate 202 and/or the rear plate 211 may include an area that is bent toward the rear plate 211 and/or the front plate 202 at an edge thereof and extends seamlessly. The extended areas of the front plate 202 and/or the rear plate 211 may be located at both ends of, for example, a long edge of the electronic device 200, but they are not limited by the above-described example.

In an embodiment, the side bezel structure 218 may include a metal and/or a polymer. In an embodiment, the rear plate 211 and the side bezel structure 218 may be integrally formed with each other and may include the same material (e.g., a metal material such as aluminum), but are not limited thereto. For example, the rear plate 211 and the side bezel structure 218 may be formed as separate structures and/or may include materials different from each other.

In an embodiment, the electronic device 200 may include at least one of a display 201, audio modules (203, 204, 207), a sensor module (not shown), camera modules (205, 212), a key input device 217, a light emitting element (not shown), and/or a connector hole 208. In an embodiment, the electronic device 200 may omit at least one (e.g., the key input device 217 or a light emitting element (not shown)) of the above-described components, or may further include other components.

In an embodiment, the display 201 (e.g., the display module 160 of FIG. 1) may be visually exposed through a corresponding opening of the front plate 202. For example, at least a portion of the display 201 may be viewed through the front plate 202 forming the first surface 200A. In an embodiment, the display 201 may be disposed on the rear surface of the front plate 202.

In an embodiment, an outer shape of the display 201 may be formed to be substantially the same as the outer shape of the front plate 202 adjacent to the display 201. In an embodiment, in order to expand an area in which the display 201 is visually exposed, an interval between an outer periphery of the display 201 and an outer periphery of the front plate 202 may be formed to be substantially the same.

In an embodiment, the display 201 (or the first surface 200A of the electronic device 200) may include a screen display area 201A. In an embodiment, the display 201 may provide visual information to the user through the screen display area 201A. In the illustrated embodiment, when the first surface 200A is viewed from the front, it is illustrated that the screen display area 201A is spaced apart from an outer periphery of the first surface 200A and is located within the first surface 200A, but the disclosure is not limited thereto. In an embodiment, when the first surface 200A is viewed from the front, at least a portion of a periphery of the screen display area 201A may substantially coincide with a periphery of the first surface 200A (or the front plate 202).

In an embodiment, the screen display area 201A may include a sensing area 201B configured to obtain biometric information of the user. Here, the meaning of "the screen display area 201A including the sensing area 201B" may be understood as at least a portion of the sensing area 201B overlapping the screen display area 201A. For example, the sensing area 201B, like other areas of the screen display area 201A, may refer to an area capable of displaying visual information by the display 201 and additionally obtaining biometric information (e.g., a fingerprint) of the user. In an embodiment, the sensing area 201B may be formed in the key input device 217.

In an embodiment, the display 201 may include an area where a first camera module 205 (e.g., the camera module 180 of FIG. 1) is located. In an embodiment, an opening may be formed in the area of the display 201, and the first camera module 205 (e.g., a punch hole camera) may be at least partially disposed in the opening to face the first surface 200A. For example, the screen display area 201A may surround at least a portion of the edge of the opening. In an embodiment, the first camera module 205 (e.g., an under display camera (UDC)) may be disposed underneath the display 201 to overlap the area of the display 201. For example, the display 201 may provide visual information to the user through the area, and additionally, the first camera module 205 may obtain an image corresponding to a direction toward the first surface 200A through the area of the display 201.

In an embodiment, the display 201 may be coupled to or disposed adjacent to a touch sensing circuit, a pressure sensor capable of measuring an intensity (pressure) of a touch, and/or a digitizer for detecting a magnetic field type of stylus pen.

In an embodiment, the audio modules (203, 204, 207) (e.g., the audio module 170 of FIG. 1) may include microphone holes (203, 204) and speaker holes 207.

In an embodiment, the microphone holes (203, 204) may include a first microphone hole 203 formed in a partial area of the third surface 200C and a second microphone hole 204 formed in a partial area of the second surface 200B. A microphone (not shown) for obtaining an external sound may be disposed inside the microphone holes (203, 204). The microphone may include a plurality of microphones to detect a direction of the sound.

In an embodiment, the second microphone hole 204 formed in a partial area of the second surface 200B may be disposed adjacent to the camera modules (205, 212). For example, the second microphone hole 204 may acquire a sound based on an operation of the camera modules (205, 212). However, the disclosure is not limited thereto.

In an embodiment, the speaker hole 207 may include an external speaker hole 207 and a call receiver hole (not shown). The external speaker hole 207 may be formed in a portion of the third surface 200C of the electronic device 200. In an embodiment, the external speaker hole 207 may be implemented as a single hole with the microphone hole 203. Although not illustrated, the call receiver hole (not shown) may be formed in another portion of the third surface 200C. For example, the call receiver hole may be formed on the third surface 200C opposite to the external speaker hole 207. For example, based on the illustration of FIG. 2, the external speaker hole 207 may be formed on the third surface 200C corresponding to the lower end of the electronic device 200, and the call receiver hole may be formed on the third surface 200C corresponding to the upper end of the electronic device 200. However, the disclosure is not limited thereto, and in an embodiment, the call receiver hole may be formed at a position other than the third surface 200C. For example, the call receiver hole may be formed by a space spaced apart between the front plate 202 (or the display 201) and the side bezel structure 218.

In an embodiment, the electronic device 200 may include at least one speaker (not shown) configured to output sound to the outside of the housing 230 through the external speaker hole 207 and/or the call receiver hole (not shown).

In an embodiment, the sensor module (not shown) (e.g., the sensor module 176 of FIG. 1) may generate an electrical signal or a data value corresponding to an internal operating state of the electronic device 200 or an external environmental state. For example, the sensor module may include at least one of a proximity sensor, a heart rate monitor (HRM) sensor, a fingerprint sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

In an embodiment, the camera modules (205, 212) (e.g., the camera module 180 of FIG. 1) may include a first camera module 205 disposed to face the first surface 200A of the electronic device 200 and a second camera module 212 disposed to face the second surface 200B.

In an embodiment, the second camera module 212 may include a plurality of cameras (e.g., a dual camera, a triple camera, or a quad camera). However, the second camera module 212 is not necessarily limited to including a plurality of cameras, and may include one camera.

In an embodiment, the first camera module 205 and the second camera module 212 may include one or more lenses, an image sensor, and/or an image signal processor.

In an embodiment, the electronic device 100 may include a flash 213 disposed to face the second surface 200B. In an embodiment, the flash 213 may include, for example, a light emitting diode or a xenon lamp. In an embodiment, two or more lenses (infrared camera, wide-angle and telephoto lenses) and image sensors may be disposed on one surface of the electronic device 200.

In an embodiment, key input devices 217 (e.g., the input module 150 of FIG. 1) may be disposed on the third surface 200C of the electronic device 200. In an embodiment, the electronic device 200 may not include some or all of the key input devices 217, and the key input devices 217 not included may be implemented in other form such as a soft key on the display 201.

In an embodiment, a connector hole 208 may be formed on the third surface 200C of the electronic device 200 to accommodate a connector of an external device. A connecting terminal (e.g., the connecting terminal 178 of FIG. 1) electrically connected to the connector of the external device may be disposed within the connector hole 208. The electronic device 200 according to an embodiment may include an interface module (e.g., the interface 177 of FIG. 1) for processing an electrical signal transmitted/received via the connection terminal.

In an embodiment, the electronic device 200 may include a light emitting device (not shown). For example, the light emitting device (not shown) may be disposed on the first surface 200A of the housing 230. The light emitting device (not shown) may provide state information of the electronic device 200 in the form of light. In an embodiment, the light emitting element (not shown) may provide a light source that interworks with an operation of the first camera module 205. For example, the light emitting device (not shown) may include a light-emitting diode (LED), an IR LED, and/or a xenon lamp.

FIG. 3 is an exploded perspective view of an electronic device according to an embodiment.

Hereinafter, a description of components having the same reference numerals as the above-described configuration will be omitted.

Referring to FIG. 3, an electronic device 200 (e.g., the electronic device 101 of FIG. 1) according to an embodiment may include a display 201, a front plate 202, a rear plate 211, a frame structure 240, a first printed circuit board 250, a second printed circuit board 252, a cover plate 260, and a battery 270.

In an embodiment, the frame structure 240 may include a sidewall 241 forming an outer appearance (e.g., the third surface 200C of FIG. 2) of the electronic device 200 and a support portion 243 extending inwardly from the sidewall 241. In an embodiment, the frame structure 240 may be disposed between the display 201 and the rear plate 211. In an embodiment, the sidewall 241 of the frame structure 240 may surround a space between the rear plate 211 and the front plate 202 (and/or the display 201), and the support portion 243 of the frame structure 240 may extend from the sidewall 241 in the space.

In an embodiment, the frame structure 240 may support or accommodate other components included in the electronic device 200. For example, the display 201 may be disposed on one surface of the frame structure 240 toward one direction (e.g., +z direction), and the display 201 may be supported by the support portion 243 of the frame structure 240. As another example, a first printed circuit board 250, a second printed circuit board 252, a battery 270, and a second camera module 212 may be disposed on the other surface of the frame structure 240 facing away from the one direction (e.g., −z direction). The first printed circuit board 250, the second printed circuit board 252, the battery 270, and the second camera module 212 may be seated in a recess defined by the sidewall 241 and/or the support portion 243 of the frame structure 240, respectively.

In an embodiment, the first printed circuit board 250, the second printed circuit board 252, and the battery 270 may be coupled to the frame structure 240, respectively. For example, the first printed circuit board 250 and the second printed circuit board 252 may be fixedly disposed onto the frame structure 240 by means of a coupling member such as a screw. For example, the battery 270 may be fixedly disposed in the frame structure 240 by means of an adhesive member (e.g., a double-sided tape). However, the disclosure is not limited to the above-described example.

In an embodiment, the cover plate 260 may be disposed between the first printed circuit board 250 and the rear plate 211. In an embodiment, the cover plate 260 may be disposed on the first printed circuit board 250. For example, the cover plate 260 may be disposed on a surface of the first printed circuit board 250 facing the −z direction.

In an embodiment, the cover plate 260 may at least partially overlap the first printed circuit board 250 with respect to the z-axis. In an embodiment, the cover plate 260 may cover at least a partial area of the first printed circuit board 250. Accordingly, the cover plate 260 may protect the first printed circuit board 250 from any physical impact or prevent a connector coupled to the first printed circuit board 250 from being separated.

In an embodiment, the cover plate 260 may be fixedly disposed on the first printed circuit board 250 through a coupling member (e.g., a screw), or may be coupled to the frame structure 240 together with the first printed circuit board 250 through the coupling member.

In an embodiment, the display 201 may be disposed between the frame structure 240 and the front plate 202. For example, the front plate 202 may be disposed on one side (e.g., the +z direction) of the display 201, and the frame structure 240 may be disposed on the other side (e.g., the −z direction).

In an embodiment, the front plate 202 may be coupled with the display 201. For example, the front plate 202 and the display 201 may be bonded to each other by means of an optical adhesive member (e.g., optically clear adhesive (OCA) or optically clear resin (OCR)) interposed therebetween.

In an embodiment, the front plate 202 may be coupled with the frame structure 240. For example, the front plate 202 may include an outer portion extending outside the display 201 when viewed in the z-axis direction, and may be bonded to the frame structure 240 through an adhesive member (e.g., a double-sided tape) disposed between the outer portion of the front plate 202 and the frame structure 240 (e.g., the sidewall 241). However, the disclosure is not limited by the above-described example.

In an embodiment, a processor (e.g., the processor 120 of FIG. 1), a memory (e.g., the memory 130 of FIG. 1), and/or an interface (e.g., the interface 177 of FIG. 1) may be mounted on the first printed circuit board 250 and/or the second printed circuit board 252. The processor may include, for example, one or more of a central processing unit, an application processor, a graphic processing unit, an image signal processor, a sensor hub processor, or a communication processor. The memory may include, for example, a volatile memory or a non-volatile memory. The interface may include, for example, a high-definition multimedia interface (HDMI), a universal serial bus (USB) interface, an SD card interface, and/or an audio interface. The interface may electrically or physically connect the electronic device 200 to an external electronic device and may include a USB connector, an SD card/MMC connector, or an audio connector. In an embodiment, the first printed circuit board 250 and the second printed circuit board 252 may be operatively or electrically connected to each other via a connection member (e.g., a flexible printed circuit board).

In an embodiment, the battery 270 (e.g., the battery 189 of FIG. 1) may supply power to at least one component of the electronic device 200. For example, the battery 270 may include a rechargeable secondary battery or a fuel cell. At least a portion of the battery 270 may be disposed on substantially the same plane as the first printed circuit board 250 and/or the second printed circuit board 252.

The electronic device 200 according to an embodiment may include an antenna module (not shown) (e.g., the antenna module 197 of FIG. 1). In an embodiment, the antenna module may be disposed between the rear plate 211 and the battery 270. The antenna module may include, for example, a near-field communication (NFC) antenna, a wireless charging antenna, and/or a magnetic secure transmission (MST) antenna. The antenna module may, for example, perform short-range communication with an external device or wirelessly transmit and receive power to and from the external device.

In an embodiment, the first camera module 205 (e.g., the front camera) may be disposed in at least a portion (e.g., the support portion 243) of the frame structure 240 such that its lens may receive external light through a partial area (e.g., the camera area 237) of the front plate 202 (e.g., the front surface 200A of FIG. 2).

In an embodiment, the second camera module 212 (e.g., a rear camera) may be disposed between the frame structure 240 and the rear plate 211. In an embodiment, the second camera module 212 may be electrically connected to the first printed circuit board 250 through a connection member (e.g., a connector). In an embodiment, the second camera module 212 may be disposed such that the lens may receive external light through the camera area 284 of the rear plate 211 of the electronic device 200.

In an embodiment, the camera area 284 may be formed on a surface (e.g., the rear surface 200B of FIG. 2) of the rear plate 211. In an embodiment, the camera area 284 may be formed to be at least partially transparent so that external light may be incident on the lens of the second camera module 212. In an embodiment, at least a portion of the camera area 284 may protrude from the surface of the rear plate 211 to a predetermined height. However, the disclosure is not limited thereto, and in an embodiment, the camera area 284 may form substantially the same plane as the surface of the rear plate 211.

In an embodiment, the housing (e.g., the housing 230 of FIG. 2) of the electronic device 200 may refer to a configuration or structure that forms at least a portion of the exterior of the electronic device 200. In this regard, at least a portion of the front plate 202, the frame structure 240, and/or the rear plate 211 forming the exterior of the electronic device 200 may be referred to as the housing 230 of the electronic device 200.

Figure 4A:
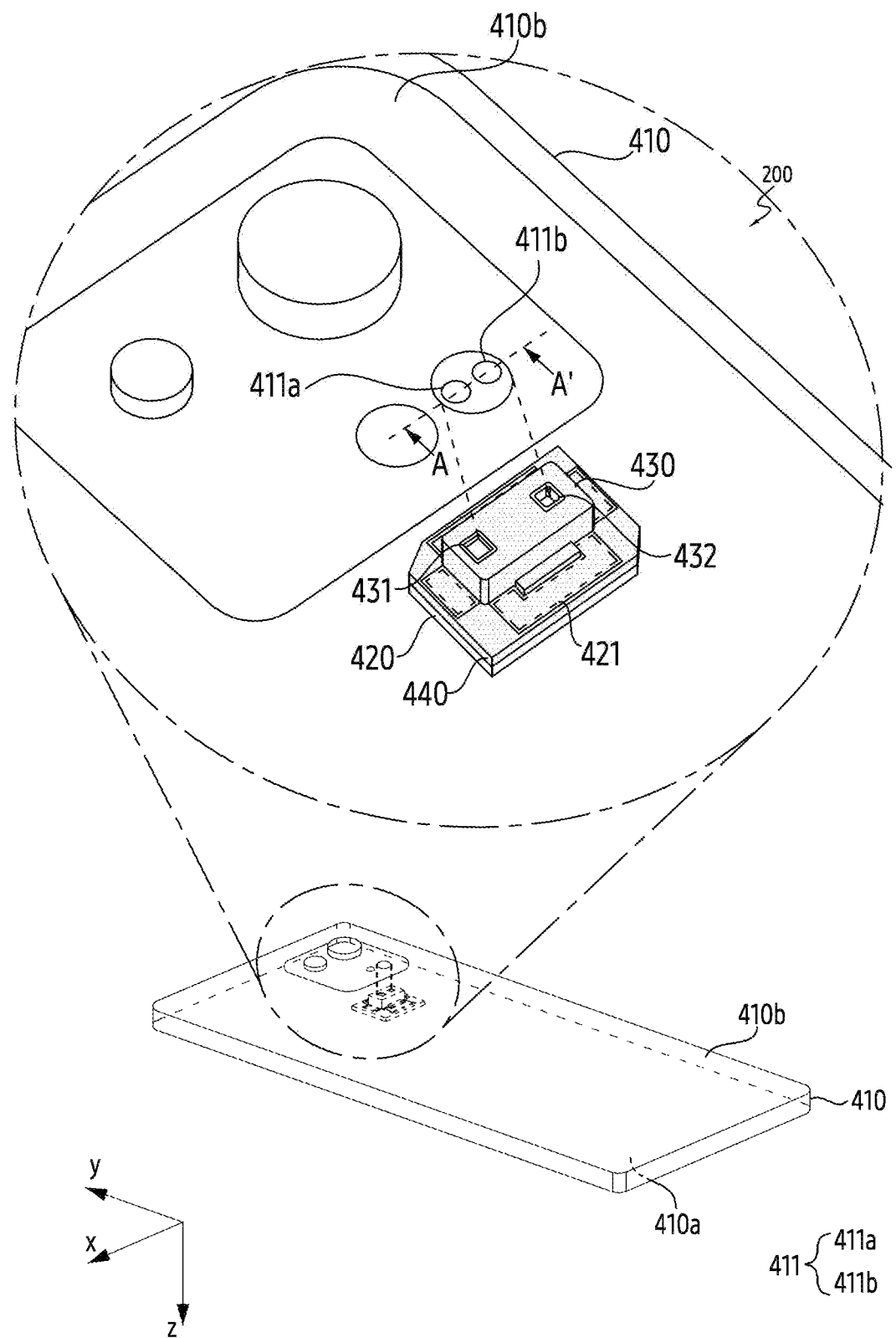
FIG. 4A is a perspective view of an example electronic device according to an embodiment.

FIG. 4A is a perspective view of an example electronic device according to an embodiment.

Figure 4B:
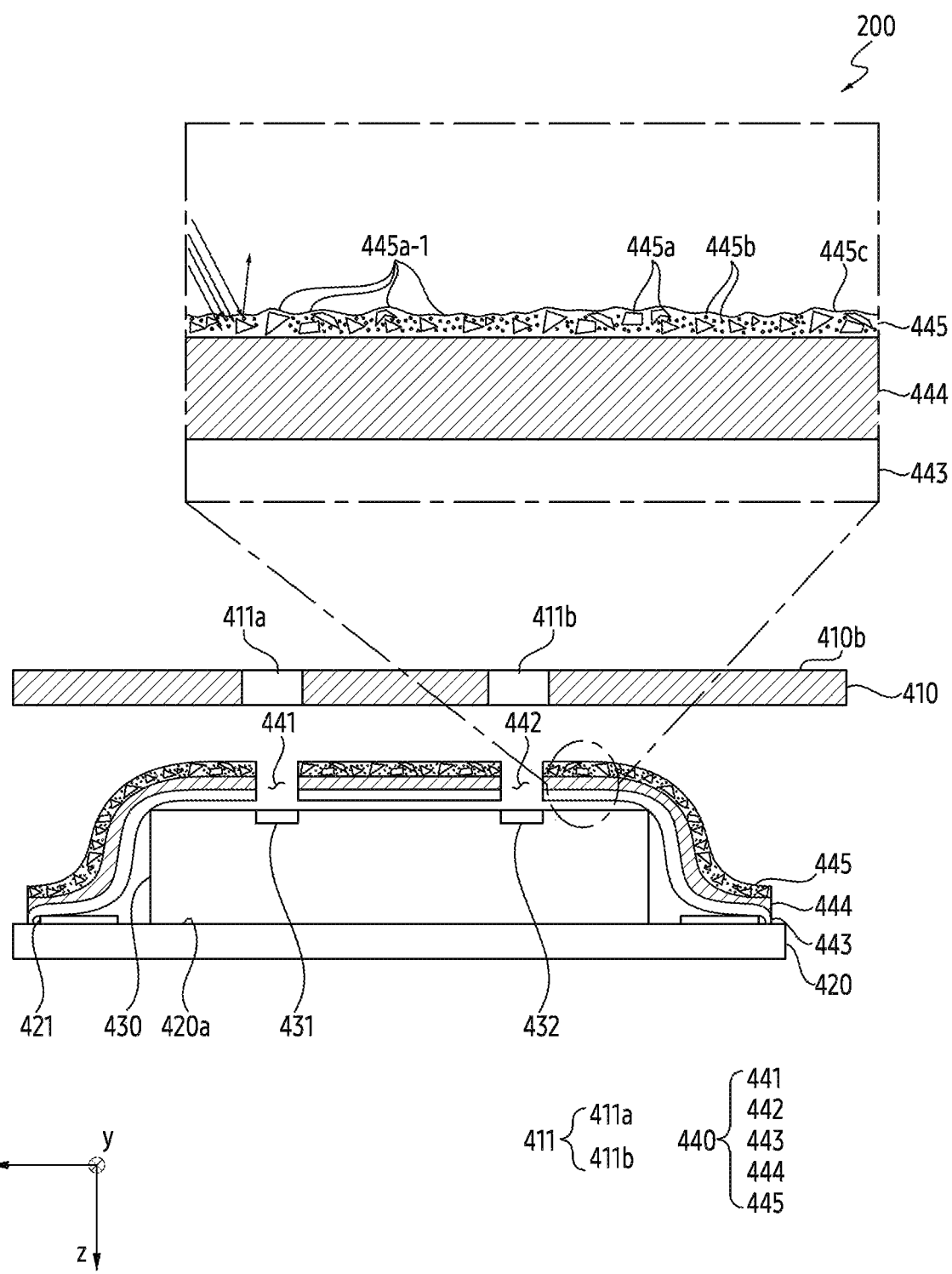
FIG. 4B is a cross-sectional view illustrating an example in which an electronic device according to an embodiment is cut along line A-A' of FIG. 4A.

FIG. 4B is a cross-sectional view illustrating an example in which an electronic device according to an embodiment is cut along line A-A' of FIG. 4A.

Referring to FIGS. 4A and 4B, the electronic device 200 (e.g., the electronic device 101 of FIG. 1) according to an embodiment may include a housing 410, a printed circuit board 420, an optical sensor 430, and/or a shielding member 440.

According to an embodiment, the housing 410 (e.g., the housing 230 of FIG. 2) may support various components of the electronic device 200. For example, one surface 410a of the housing 410 may support a display (e.g., the display 201 of FIG. 2). The display 201 may be disposed on one surface 410a of the housing 410 (e.g., in the +z direction). According to an embodiment, the housing 410 may provide at least a portion of an outer surface of the electronic device 200. The other surface 410b of the housing 410 may define at least a portion of the rear surface of the electronic device 200. The other surface 410b of the housing 410 may be opposite to one surface 410a of the housing 410. For example, the direction (e.g., the −z direction) in which the other surface 410b of the housing 410 faces may be opposite to the direction (e.g., the +z direction) in which one surface 410a of the housing 410 faces. The other surface 410b of the housing 410 may be substantially parallel to one surface 410a of the housing 410. According to an embodiment, the housing 410 may accommodate various components of the electronic device 200. For example, the housing 410 may accommodate the printed circuit board 420, the optical sensor 430, and/or the shielding member 440. For example, the housing 410 may cover (surround) the printed circuit board 420, the optical sensor 430, and/or the shielding member 440.

According to an embodiment, the housing 410 may include at least one opening region 411. The at least one opening region 411 may provide an optical path of light from the outside of the housing 410 transmitted into the housing 410 or light from the inside of the housing 410 transmitted to the outside of the housing 410. For example, the at least one opening region 411 may refer to an area made of a substantially transparent or translucent material among areas of the housing 410. The position of the at least one opening region 411 may correspond to the position of the optical sensor 430. The at least one opening region 411 may be disposed on the optical sensor 430, when viewed from a direction (e.g., the −z direction) in which the other surface 410b faces. For example, the at least one opening region 411 may be spaced apart from the optical sensor 430 along the direction (e.g., the −z direction) in which the other surface 410b of the housing 410 faces. According to an embodiment, the at least one opening region 411 may include a first opening region 411a and a second opening region 411b. Each of the first opening region 411a and the second opening region 411b may overlap a portion of the optical sensor 430. For example, the first opening region 411a may overlap the light emitting unit 431 of the optical sensor 430. For example, the second opening region 411b may overlap the light receiving unit 432 of the optical sensor 430. However, the disclosure is not limited thereto. For example, the at least one opening region 411 may include only one opening region overlapping the light emitting unit 431 and the light receiving unit 432 of the optical sensor 430.

According to an embodiment, the printed circuit board 420 may establish an electrical connection between electronic components of the electronic device 200. For example, the printed circuit board 420 may establish an electrical connection between electronic components disposed on the printed circuit board 420 (e.g., in the −z direction). For example, the printed circuit board 420 may establish an electrical connection between the optical sensor 430 supported by the printed circuit board 420 and the processor (e.g., the processor 120 of FIG. 1). The printed circuit board 420 may be disposed in the housing 410. For example, the printed circuit board 420 may be disposed between one surface 410a of the housing 410 and the other surface 410b of the housing 410.

According to an embodiment, the printed circuit board 420 may include a ground pad 421. The ground pad 421 may be exposed to the outside of the printed circuit board 420. For example, the ground pad 421 may be exposed onto one surface 420a of the printed circuit board 420. For example, the ground pad 421 may protrude from one surface 420a of the printed circuit board 420, but the disclosure is not limited thereto. For example, the ground pad 421 may define one plane together with one surface 420a of the printed circuit board 420, or may be recessed into the printed circuit board 420. The ground pad 421 may be electrically connected to an electrical ground of the printed circuit board 420. For example, the ground pad 421 may be electrically connected to a ground layer (not shown) in the printed circuit board 420. As the ground pad 421 is electrically connected to the ground layer in the printed circuit board 420, the ground pad 421 may form an electrical ground of the printed circuit board 420. For example, the ground pad 421 may include a conductive material. According to an embodiment, the ground pad 421 may be referred to as a ground area.

According to an embodiment, the optical sensor 430 may be configured to obtain data from the outside of the electronic device 200. For example, the optical sensor 430 may be configured to obtain data for identifying a distance from an external object of the electronic device 200, based on receiving light from the outside of the electronic device 200. For example, the optical sensor 430 may include a time of flight (TOF) sensor, but it is not limited thereto. According to an embodiment, the optical sensor 430 may include a light emitting unit 431 and a light receiving unit 432. The light emitting unit 431 may emit light in a specified wavelength band toward the outside of the electronic device 200. The light emitting unit 431 may emit light in a specified wavelength band toward the other surface 410b of the housing 410. For example, the light emitting unit 431 may be configured to emit light having an infrared wavelength, but it is not limited thereto. Light emitted from the light emitting unit 431 may be transmitted to the outside of the electronic device 200, passing through at least one opening region 411 of the housing 410. Light from the light emitting unit 431 transmitted to the outside of the electronic device 200 may be reflected from an object (not shown) outside the electronic device 200. The light receiving unit 432 may be configured to receive light reflected from an object outside the electronic device 200.

The light receiving unit 432 may be configured to receive light having a specified wavelength band. For example, the light receiving unit 432 may receive light reflected from an object outside the electronic device 200 after being emitted from the light emitting unit 431 to the outside of the electronic device 200. The electronic device 200 (or the processor 120 of FIG. 1) may identify a distance between the electronic device 200 and the object outside the electronic device 200, based on a time duration up until the light emitted from the light emitting unit 431 is reflected from the object outside the electronic device 200 and then received by the light receiving unit 432. The electronic device 200 (or the processor 120 of FIG. 1) may identify the distance between the electronic device 200 and the object outside the electronic device 200, based on a phase difference in between the light emitted from the light emitting unit 431 and the light received by the light receiving unit 432.

According to an embodiment, the optical sensor 430 may be disposed inside the housing 410. For example, the optical sensor 430 may be oriented in the direction (e.g., the −z direction) in which the other surface 410b of the housing 410 faces within the housing 410, but the disclosure is not limited thereto. For example, the optical sensor 430 may be oriented in a direction (e.g., the +z direction) in which one surface 410a of the housing 410 faces within the housing 410. According to an embodiment, the optical sensor 430 may be disposed on the printed circuit board 420. For example, the optical sensor 430 may be disposed on one surface 420a of the printed circuit board 420. For example, the optical sensor 430 may be supported by the one surface 420a of the printed circuit board 420.

According to an embodiment, the shielding member 440 may shield the optical sensor 430 to reduce noise caused by electromagnetic waves generated in the electronic device 200. For example, the shielding member 440 may reduce transmission of electromagnetic waves from the outside of the optical sensor 430 to the optical sensor 430. For example, the shielding member 440 may reduce transmission of electromagnetic waves emitted from the optical sensor 430 to the outside of the optical sensor 430. The shielding member 440 may be electrically connected to the ground pad 421. For example, the shielding member 440 may be electrically connected to the ground pad 421 by coming into physical contact with the ground pad 421. The shielding member 440 may be electrically connected to a ground layer in the printed circuit board 420 by being physically connected to the ground pad 421. According to an embodiment, the shielding member 440 may be disposed on the optical sensor 430. The shielding member 440 may cover at least a portion of the optical sensor 430 and the printed circuit board 420. The shielding member 440 may cover at least a portion of the optical sensor 430 and the printed circuit board 420. A portion of the shielding member 440 may come into contact with the ground pad 421 disposed on one surface 420a of the printed circuit board 420. Another portion of the shielding member 440 may cover at least a portion of an outer surface of the optical sensor 430 substantially parallel to one surface 420a of the printed circuit board 420, and an outer side surface of the optical sensor 430 substantially perpendicular to one surface 420a of the printed circuit board 420. For example, the shielding member 440 may be in direct contact with the outer surface and the outer side surface of the optical sensor 430, but the disclosure not limited thereto. For example, the shielding member 440 may cover the outer surface and the outer side surface of the optical sensor 430 by coming into direct contact with a mold (not shown) covering the outer surface and the outer side surface of the optical sensor 430. For example, the shielding member 440 may have the form of a film covering at least a portion of the optical sensor 430 and the printed circuit board 420, but the disclosure is not limited thereto. According to an embodiment, the shielding member 440 may include a first opening 441, a second opening 442, a first adhesive layer 443, a first shielding layer 444, and/or a first cover layer 445.

According to an embodiment, the first opening 441 may provide a travelling path through which light emitted from the light emitting unit 431 may move to the outside of the shielding member 440. The first opening 441 may correspond to the light emitting unit 431 of the optical sensor 430. The first opening 441 may be disposed on the light emitting unit 431 of the optical sensor 430. The position of the first opening 441 may correspond to the position of the light emitting unit 431. For example, when the optical sensor 430 is viewed along a direction (e.g., the +z direction) in which one surface 410a of the housing 410 faces, at least a portion of the first opening 441 may overlap the light emitting unit 431. According to an embodiment, the first opening 441 may pass through the shielding member 440. For example, the first opening 441 may pass through the first adhesive layer 443, the first shielding layer 444, and/or the first cover layer 445. For example, the first opening 441 may be located in the first adhesive layer 443, the first shielding layer 444, and/or the first cover layer 445.

According to an embodiment, the second opening 442 may provide a travelling path through which light outside the shielding member 440 may move into the shielding member 440. The second opening 442 may correspond to the light receiving unit 432 of the optical sensor 430. The second opening 442 may be disposed on the light receiving unit 432 of the optical sensor 430. The position of the second opening 442 may correspond to the position of the light receiving unit 432. For example, when the optical sensor 430 is viewed along a direction (e.g., the +z direction) in which one surface 410a of the housing 410 faces, at least a portion of the second opening 442 may overlap the light receiving unit 432. According to an embodiment, the second opening 442 may pass through the shielding member 440. For example, the second opening 442 may pass through the first adhesive layer 443, the first shielding layer 444, and/or the first cover layer 445. For example, the second opening 442 may be located in the first adhesive layer 443, the first shielding layer 444, and/or the first cover layer 445.

According to an embodiment, the first adhesive layer 443 may attach the shielding member 440 onto the optical sensor 430 and/or the printed circuit board 420 (e.g., in the −z direction). For example, the first adhesive layer 443 may include an adhesive material. For example, the first adhesive layer 443 may include a pressure sensitive adhesive (PSA). According to an embodiment, the first adhesive layer 443 may be disposed on the optical sensor 430 and the ground pad 421 (e.g., in the −z direction). The first adhesive layer 443 may be attached onto the optical sensor 430 and the ground pad 421. For example, the first adhesive layer 443 may come into contact with the optical sensor 430 and the ground pad 421. According to an embodiment, the first adhesive layer 443 may be electrically connected to the ground pad 421. For example, the first adhesive layer 443 may include a conductive material (e.g., graphite and/or nickel) that electrically connects the ground pad 421 with the first shielding layer 444. The conductive material may be mixed, for example, into an adhesive material included in the first adhesive layer 443. The first shielding layer 444 may be electrically connected to the ground pad 421 via the first adhesive layer 443, by means of a conductive material included in the first adhesive layer 443.

According to an embodiment, the first shielding layer 444 may be electrically connected to the ground pad 421 of the printed circuit board 420 such that the optical sensor 430 is shielded. The first shielding layer 444 may include at least one of a nano fiber and a metal electrically connected to the ground pad 421. For example, the first shielding layer 444 may be formed by coating a nano fiber with a metal. For example, the first shielding layer 444 may be formed by sequentially coating nickel, copper, and nickel onto the nano fiber. For example, the first shielding layer 444 may be formed by coating a metal including copper and aluminum on the first adhesive layer 443. The first shielding layer 444 may be disposed on the first adhesive layer 443 (e.g., in the −z direction). For example, the first shielding layer 444 may be in direct contact with the first adhesive layer 443. According to an embodiment, a thickness of the first shielding layer 444 may be larger than a skin depth of electromagnetic waves to be shielded by the first shielding layer 444. The skin depth may refer to a depth of a region of a conductor through which a current within a specified amount of reduction (e.g., 1 neper) flows when electromagnetic waves are applied to the conductor. For example, the thickness of the first shielding layer 444 may be 5 times or more of the skin depth of the electromagnetic wave to be shielded by the first shielding layer 444. For example, when the first shielding layer 444 is formed of aluminum, the thickness of the first shielding layer 444 may be 15 μm more, but the disclosure is not limited thereto.

According to an embodiment, the first cover layer 445 may protect the shielding member 440. For example, the first cover layer 445 may define an outer surface of the shielding member 440. The first cover layer 445 may be disposed on the first shielding layer 444 (e.g., in the −z direction). For example, the first cover layer 445 may be in direct contact with the first shielding layer 444. The first cover layer 445 may reduce noise of the optical sensor 430 by reducing a portion of light transmitted to the light receiving unit 432 of the optical sensor 430. According to an embodiment, the first cover layer 445 may include a plurality of first particles 445a, a plurality of second particles 445b, and/or a binder 445c.

According to an embodiment, the plurality of first particles 445a may be configured to reflect or scatter light. The plurality of first particles 445a may be configured to diffusely reflect light. For example, the light emitted from the light emitting unit 431 of the optical sensor 430 may be reflected from inside of the housing 410 after being emitted from the light emitting unit 431. For example, the light emitted from the light emitting unit 431 may be transmitted to the light receiving unit 432 by being reflected from the inside of the housing 410. Light from the light emitting unit 431 reflected from the inside of the housing 410 may be received by the light receiving unit 432, thereby causing noise in the optical sensor 430. The plurality of first particles 445a may reflect or scatter some of the light incident into the first cover layer 445, thereby reducing the transfer of the light reflected from the inside of the housing 410 to the light receiving unit 432. For example, the plurality of first particles 445a may reflect or scatter some of light incident on the second opening 442 at an angle exceeding a specified angle. According to an embodiment, each of the plurality of first particles 445a may include metal particles configured to reflect or scatter light. For example, each of the plurality of first particles 445a may be made of nickel, but the disclosure is not limited thereto. According to an embodiment, the plurality of first particles 445a may be disposed in the first cover layer 445. For example, the plurality of first particles 445a may be disposed substantially irregularly in the first cover layer 445. According to an embodiment, the plurality of first particles 445a may have an irregular shape such that light is diffusely reflected. For example, the shape of some of the plurality of first particles 445a may be different from the shape of the other some of the plurality of first particles 445a. For example, a size of each of the plurality of first particles 445a may be 1 µm to 10 µm, but the disclosure is not limited thereto.

As the plurality of first particles 445a have an irregular shape, the cover layer 445 may include a plurality of irregularities 445a-1 disposed on the outer surface of the cover layer 445. The plurality of irregularities 445a-1 may be defined by the plurality of first particles 445a disposed in the cover layer 445. The plurality of irregularities 445a-1 may have different heights. For example, the distance between one of the plurality of irregularities 445a-1 and the first shielding layer 444 may be different from the distance between the other one of the plurality of irregularities 445a-1 and the first shielding layer 444. As the first cover layer 445 includes the plurality of irregularities 445a-1 formed on the outer surface of the first cover layer 445, light incident on the first cover layer 445 may be diffusely reflected by the plurality of irregularities 445a-1. As light is diffusely reflected by the plurality of irregularities 445a-1, noise of the optical sensor 430 may be reduced.

According to an embodiment, the plurality of second particles 445b may be configured to absorb light. For example, the light emitted from the light emitting unit 431 may be reflected in the housing 410 without being transmitted to the outside of the electronic device 200. The plurality of second particles 445b may absorb light that is transmitted to the cover layer 445 by being reflected from the inside the electronic device 200 after being emitted from the light emitting unit 431. The plurality of second particles 445b may absorb light that causes noise of the optical sensor 430 by being emitted from the light emitting unit 431 and then reflected inside the housing 410. For example, the plurality of second particles 445b may absorb some of the light incident on the second opening 442 by exceeding a specified angle. According to an embodiment, the plurality of second particles 445b may include a material that absorbs light. For example, the plurality of second particles 445b may include carbon-black. According to an embodiment, the size of each of the plurality of second particles 445b may be smaller than the size of each of the plurality of first particles 445a. For example, a plurality of second particles 445b may be disposed between each of the plurality of first particles 445a. According to an embodiment, the plurality of second particles 445b may be disposed in the first cover layer 445. The plurality of second particles 445b may be distributed in the first cover layer 445. For example, the plurality of second particles 445b may be disposed substantially uniformly, but the disclosure is not limited thereto. For example, a plurality of second particles 445b may be disposed substantially non-uniformly. As the plurality of second particles 445b are distributed in the first cover layer 445, the first cover layer 445 may have a substantially black color.

According to an embodiment, the binder 445c may cover (surround) each of the plurality of first particles 445a and each of the plurality of second particles 445b. The binder 445c may cover each of the plurality of first particles 445a and each of the plurality of second particles 445b. The binder 445c may fill up a gap between the plurality of first particles 445a and a gap between the plurality of second particles 445b. The binder 445c may physically connect the plurality of first particles 445a and the plurality of second particles 445b. The binder 445c may define a mixture together with the plurality of first particles 445a and the plurality of second particles 445b. For example, the first cover layer 445 may be formed by accommodating the plurality of first particles 445a and the plurality of second particles 445b in a base solution mixed with a binder 445c, a curing agent, and a solvent. According to an embodiment, the binder 445c may have a degree of flexibility. According to an embodiment, the binder 445c may define one layer together with the plurality of first particles 445a and the plurality of second particles 445b. For example, when only the plurality of first particles 445a and the binder 445c are included in the first cover layer 445 and the plurality of second particles 445b are manufactured as a separate layer, the layer manufactured by the plurality of second particles 445b has brittleness, and therefore, damage may occur due to stress of the layer manufactured by the plurality of second particles 445b. When the plurality of second particles 445b are manufactured as a separate layer, an adhesive layer may be required for bonding the first shielding layer 444 and the layer manufactured by the plurality of second particles 445b, and thus, the thickness of the shielding member 440 may be relatively increased. Since the plurality of first particles 445a and the plurality of second particles 445b form one layer together with the binder 445c, the electronic device 200 according to an embodiment may provide a structure capable of reducing damage to the shielding member 440 due to the stress while securing a space in which components in the electronic device 200 are arranged.

According to an embodiment, the binder 445c may include a material having relatively high thermostability. For example, the binder 445c may include polyurethane (PU). For example, the coefficient of thermal expansion of the polyurethane contained in the binder 445c may be $5*10^-5/K$. By the plurality of first particles 445a and the plurality of second particles 445b included in the first cover layer 445, the thermostability of the first cover layer 445 may be relatively increased compared to the thermostability of the binder 445c. For example, the coefficient of thermal expansion of the first cover layer 445 may be 10% or less of the coefficient of thermal expansion of the binder 445c, but the disclosure is not limited thereto. When the electronic device 200 is manufactured, heat may be transferred to the shielding member 440. For example, heat may be transferred to the shielding member 440 by a reflow process for melting solder electrically connecting the optical sensor 430 and the printed circuit board 420. When the binder 445c has low thermostability, as a contraction of the shielding member 440 is caused by the heat transferred by the shielding member 440, a portion of the first adhesive layer 443 may be separated from the ground pad 421. When the first adhesive layer 443 is separated from the ground pad 421, the shielding member 440 may not shield the optical sensor 430. Since the binder 445c has relatively high thermostability, the electronic device 200 according to an embodiment may provide a structure capable of reducing deformation of the shielding member 440 due to heat. As the deformation of the shielding member 440 due to the heat is reduced, the first adhesive layer 443 and the ground pad 421 may remain in contact with each other.

According to an embodiment, the binder 445c may have a light transmittance higher than that of each of the plurality of first particles 445a and the plurality of second particles 445b. As the binder 445c has a light transmittance higher than the light transmittance of each of the plurality of first particles 445a and the plurality of second particles 445b, light may be transmitted into the first cover layer 445. The light transmitted into the first cover layer 445 may be reflected or scattered by the plurality of first particles 445a or absorbed by the plurality of second particles 445b. By the plurality of first particles 445a and the plurality of second particles 445b, the first cover layer 445 may have a relatively low surface reflectance. For example, the surface reflectance of the first cover layer 445 may be substantially 3 to 3.5, but the disclosure is not limited thereto.

According to an embodiment, the plurality of first particles 445a may be contained in the first cover layer 445 at a first ratio, the plurality of second particles 445b may be contained in the first cover layer 445 at a second ratio, and the binder 445c may be contained in the first cover layer 445 at a third ratio. The first ratio may refer to a weight ratio of the plurality of first particles 445a to the total weight of the first cover layer 445. The second ratio may refer to a weight ratio of the plurality of second particles 445b to the total weight of the first cover layer 445. The third ratio may refer to a weight ratio of the binder 445c to the total weight of the first cover layer 445. For example, the first ratio may be preferably 12 to 45%, the second ratio may be preferably 30 to 72%, and the third ratio may be preferably 10 to 40%. For example, the first ratio may be more preferably 40%, the second ratio may be more preferably 40%, and the third ratio may be more preferably 20%. For example, the weight ratio of the plurality of first particles 445a to the weight of the first cover layer 445 except for the binder 445c may be preferably 20 to 50%, and the weight ratio of the plurality of second particles 445b thereto may be preferably 50 to 80%.

As described above, the plurality of first particles 445a for reflecting or scattering light and the plurality of second particles 445b for absorbing light are included in a single layer, and therefore, the electronic device 200 according to an embodiment may provide a structure capable of reducing damage to the shielding member 440 due to the stress while securing a space for accommodating components in the electronic device 200. Since the first cover layer 445 has a relatively high thermostability, the electronic device 200 according to an embodiment may provide a structure capable of reducing damage to the shielding member 440.

While FIGS. 4A and 4B illustrate that the shielding member 440 surrounds the optical sensor 430, the use of the shielding member 440 is not limited thereto. For example, the shielding member 440 may be utilized to shield other electronic components other than the optical sensor 430.

Figure 5:
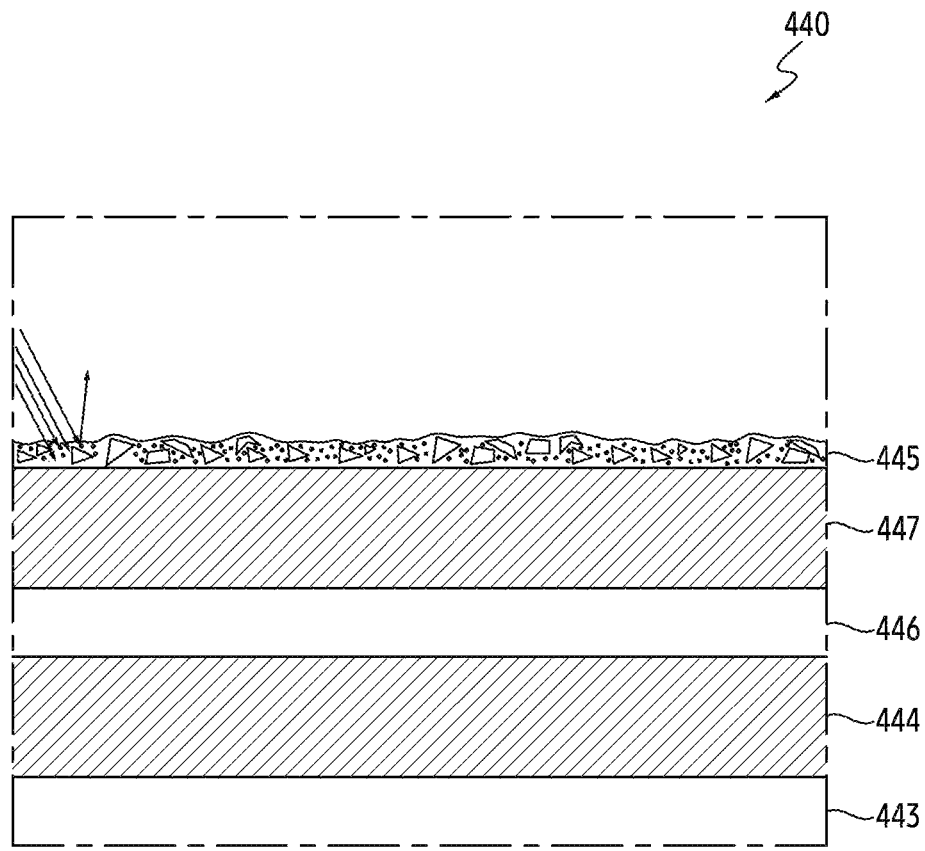
FIG. 5 is a cross-sectional view of an example shielding member according to an embodiment.

FIG. 5 is a cross-sectional view of an example shielding member according to an embodiment.

Referring to FIG. 5, the shielding member 440 according to an embodiment may include a first adhesive layer 443, a first shielding layer 444, a first cover layer 445, a second adhesive layer 446, and/or a second shielding layer 447.

The shielding member 440 of FIG. 5 may be the shielding member 440 in which the second adhesive layer 446 and the second shielding layer 447 are further added to the shielding member 440 of FIGS. 4A and 4B, and thus a redundant description thereof will be omitted.

According to an embodiment, the first adhesive layer 443 may be disposed on the optical sensor (e.g., the optical sensor 430 of FIGS. 4A and 4B) and the printed circuit board (e.g., the printed circuit board 420 of FIGS. 4A and 4B) (e.g., in the −z direction).

According to an embodiment, the first shielding layer 444 may be disposed on the first adhesive layer 443. The first shielding layer 444 may come into contact with the first adhesive layer 443.

According to an embodiment, the second adhesive layer 446 may attach the first shielding layer 444 onto the second shielding layer 447. The second adhesive layer 446 may be formed to be substantially the same as the first adhesive layer 443. For example, the second adhesive layer 446 may include an adhesive material. For example, the second adhesive layer 446 may include a pressure sensitive adhesive (PSA). According to an embodiment, the second adhesive layer 446 may be electrically connected to a ground pad (e.g., the ground pad 421 of FIGS. 4A and 4B). For example, the second adhesive layer 446 may include a conductive material (e.g., graphite and/or nickel) that electrically connects the ground pad 421 and the second shielding layer 446. The conductive material may be mixed, for example, into an adhesive material included in the second adhesive layer 446. According to an embodiment, the second adhesive layer 446 may be disposed on the first shielding layer 444. The second adhesive layer 446 may be in direct contact with the first shielding layer 444. The second adhesive layer 446 may be interposed between the first shielding layer 444 and the second shielding layer 447.

According to an embodiment, the second shielding layer 447 may be formed to be substantially the same as the first shielding layer 444. For example, the second shielding layer 447 may include at least one of a nano fiber and a metal electrically connected to the ground pad 421 of the printed circuit board 420. For example, the second shielding layer 447 may be formed by coating the nano fiber with metal. For example, the second shielding layer 447 may be formed by sequentially coating nickel, copper, and nickel on the nano fiber. For example, the second shielding layer 447 may be formed by coating a metal including copper and aluminum on the second adhesive layer 446. The second shielding layer 447 may be electrically connected to the first shielding layer 444 via the second adhesive layer 446. The second shielding layer 447 may be electrically connected to the ground pad 421 by being electrically connected to the first shielding layer 444. As the second shielding layer 447 is electrically connected to the ground pad 421, the shielding performance of the shielding member 440 may be increased. According to an embodiment, the second shielding layer 447 may be disposed on the second adhesive layer 446. The second shielding layer 447 may be in direct contact with the second adhesive layer 446. The second shielding layer 447 may be interposed between the second adhesive layer 446 and the first cover layer 445. According to an embodiment, the thickness of the second shielding layer 447 may be larger than a skin depth of the electromagnetic wave to be shielded by the second shielding layer 447. For example, the thickness of the second shielding layer 447 may be 5 times or more of the skin depth of the electromagnetic wave to be shielded by the second shielding layer 447. For example, when the second shielding layer 447 is formed of aluminum, the thickness of the second shielding layer 447 may be 15 µm or more, but the disclosure is not limited thereto.

According to an embodiment, the first cover layer 445 may be disposed on the second shielding layer 447. The first cover layer 445 may be in direct contact with the second shielding layer 447. The first cover layer 445 may be exposed to the outside of the shielding member 440. For example, when the second adhesive layer 446 and the second shielding layer 447 are omitted, an impact transmitted from the outside of the shielding member 440 may be transmitted to the first shielding layer 444 in the shielding member 440, when the electronic device (e.g., the electronic device 200 of FIGS. 4A and 4B) is manufactured or while the electronic device (e.g., the electronic device 200 of FIGS. 4A and 4B) is in use. When at least a portion of the first shielding layer 444 is disconnected by the impact transmitted to the first shielding layer 444, the performance of shielding of the first shielding layer 444 may decrease. The shielding member 440 according to an embodiment may provide a structure capable of reducing damage to the first shielding layer 444 by the second adhesive layer 446 and the second shielding layer 447 interposed between the first cover layer 445 and the first shielding layer 444.

Although not illustrated in FIG. 5, the shielding member 440 according to an embodiment may include at least one opening (e.g., the first opening 441 and/or the second opening 442 of FIG. 4B). According to an embodiment, the at least one opening (e.g., the first opening 441 and/or the second opening 442 of FIG. 4B) may penetrate the shielding member 440. For example, the at least one opening (e.g., the first opening 441 and/or the second opening 442 of FIG. 4B) may penetrate the first adhesive layer 443, the first shielding layer 444, the second adhesive layer 446, the second shielding layer 447, and/or the first cover layer 445. For example, the first opening 441 of at least one opening (e.g., the first opening 441 and/or the second opening 442 of FIG. 4B) may be located in the first adhesive layer 443, the first shielding layer 444, the second adhesive layer 446, the second shielding layer 447, and/or the first cover layer 445.

As described above, the shielding member 440 according to an embodiment may provide a structure in which the performance of the shielding member 440 is increased while reducing damage caused by an impact from the outside of the shielding member 440 by the second shielding layer 447 interposed between the first cover layer 445 and the first shielding layer 444.

Figure 6:
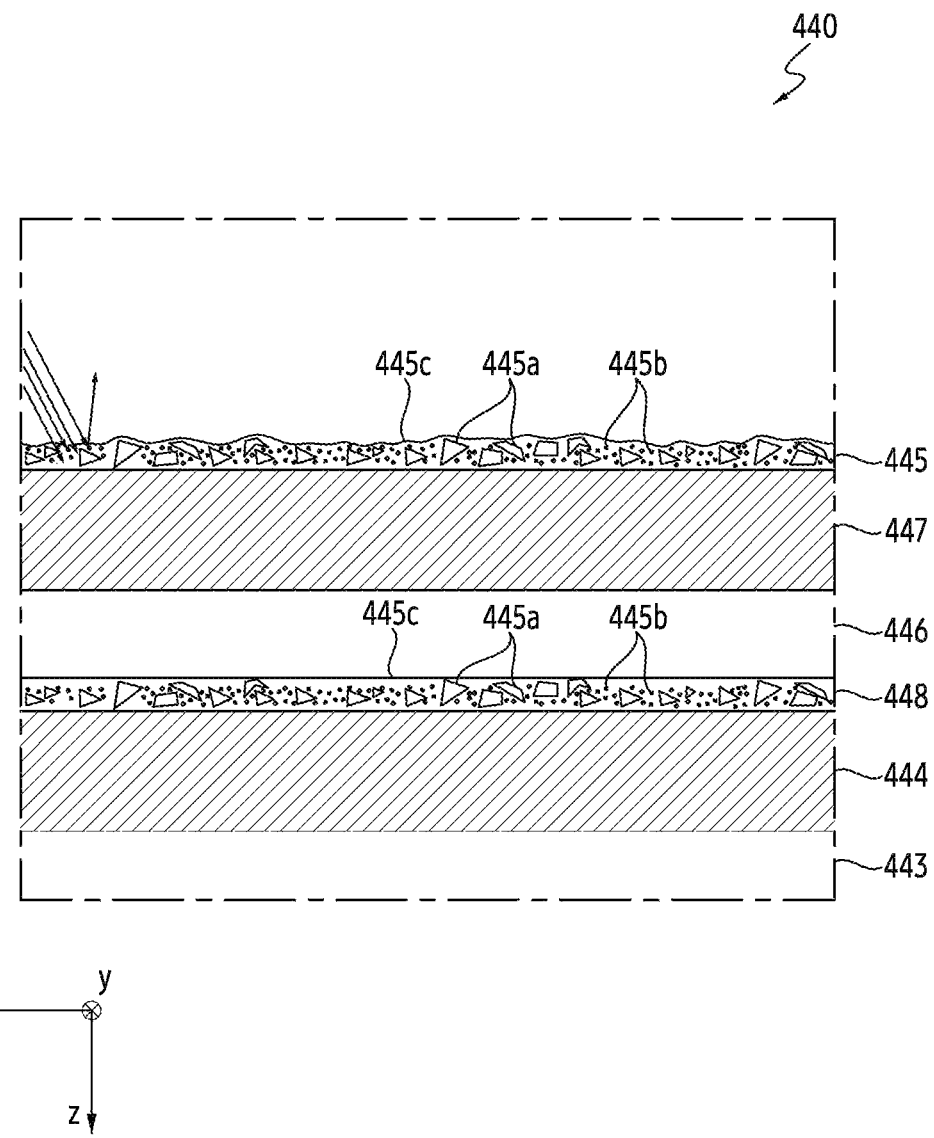
FIG. 6 is a cross-sectional view of an example shielding member according to an embodiment.

FIG. 6 is a cross-sectional view of an example shielding member according to an embodiment.

Referring to FIG. 6, the shielding member 440 according to an embodiment may include a first adhesive layer 443, a first shielding layer 444, a first cover layer 445, a second adhesive layer 446, a second shielding layer 447, and/or a second cover layer 448.

The shielding member 440 of FIG. 6 may be the shielding member 440 in which the second adhesive layer 446, the second shielding layer 447, and the second cover layer 448 are further added in between the first shielding layer 444 and the first cover layer 445 in the shielding member 440 of FIGS. 4A and 4B, and therefore, any redundant description thereof will be omitted.

According to an embodiment, the first adhesive layer 443 may be disposed on an optical sensor (e.g., the optical sensor 430 of FIGS. 4A and 4B) and a printed circuit board (e.g., the printed circuit board 420 of FIGS. 4A and 4B).

According to an embodiment, the first shielding layer 444 may be disposed on the first adhesive layer 443 (e.g., in the −z direction). The first shielding layer 444 may be in contact with the first adhesive layer 443.

According to an embodiment, the first cover layer 445 may be disposed on the first adhesive layer 443. For example, the first cover layer 445 may be spaced apart from the first shielding layer 444. For example, the first cover layer 445 may be disposed on the second shielding layer 447.

According to an embodiment, the second cover layer 448 may be interposed between the first shielding layer 444 and the first cover layer 445. The second cover layer 448 may be disposed on the first shielding layer 444. The second cover layer 448 may be interposed between the first shielding layer 444 and the second adhesive layer 446. Since the second cover layer 448 may be formed to be substantially the same as the first cover layer 444, any redundant description thereof will be omitted. For example, the second cover layer 448 may include a plurality of first particles 445a, a plurality of second particles 445b, and/or a binder 445c.

According to an embodiment, the second adhesive layer 446 may attach the second shielding layer 447 onto the second cover layer 448. The second adhesive layer 446 may be formed to be substantially the same as the first adhesive layer 443. For example, the second adhesive layer 446 may include an adhesive material. For example, the second adhesive layer 446 may include a pressure sensitive adhesive (PSA). According to an embodiment, the second adhesive layer 446 may be disposed on the second cover layer 448. The second adhesive layer 446 may be interposed between the second cover layer 448 and the second shielding layer 447.

According to an embodiment, the second shielding layer 447 may be formed to be substantially the same as the first shielding layer 444. For example, the second shielding layer 447 may include at least one of a nano fiber and a metal. According to an embodiment, the second shielding layer 447 may be disposed on the second adhesive layer 446. The second shielding layer 447 may be interposed between the second adhesive layer 446 and the first cover layer 445. For example, when the second adhesive layer 446, the second shielding layer 447, and the second cover layer 448 are omitted, an impact transmitted from the outside of the shielding member 440 may be transmitted to the first shielding layer 444 in the shielding member 440, when the electronic device (e.g., the electronic device 200 of FIGS. 4A and 4B) is manufactured or while the electronic device (e.g., the electronic device 200 of FIGS. 4A and 4B) is in use. When at least a portion of the first shielding layer 444 is disconnected by the impact transmitted to the first shielding layer 444, the performance of shielding of the first shielding layer 444 may decrease. The shielding member 440 according to an embodiment may provide a structure capable of reducing damage to the first shielding layer 444, due to the second adhesive layer 446, the second shielding layer 447, and the second cover layer 448 interposed between the first cover layer 445 and the first shielding layer 444.

While not shown in FIG. 6, the shielding member 440 according to an embodiment may include at least one opening (e.g., the first opening 441 and/or the second opening 442 of FIG. 4B). According to an embodiment, the at least one opening (e.g., the first opening 441 and/or the second opening 442 of FIG. 4B) may penetrate the shielding member 440. For example, the at least one opening (e.g., the first opening 441 and/or the second opening 442 of FIG. 4B) may penetrate the first adhesive layer 443, the first shielding layer 444, the second cover layer 448, the second adhesive layer 446, the second shielding layer 447, and/or the first cover layer 445. For example, the at least one opening (e.g., the first opening 441 and/or the second opening 442 of FIG. 4B) may be located in the first adhesive layer 443, the first shielding layer 444, the second cover layer 448, the second adhesive layer 446, the second shielding layer 447, and/or the first cover layer 445.

As described above, the shielding member 440 according to an embodiment may provide a structure capable of reducing damage to the first shielding layer 444, since the second adhesive layer 446, the second shielding layer 447, and the second cover layer 448 are interposed between the first cover layer 445 and the first shielding layer 444.

When an electronic device is manufactured, the shielding member covering the electronic components may receive heat that causes the shielding member to be deformed. When the shielding member is deformed by heat, the electrical connection between the shielding member and the ground of the printed circuit board is disconnected, resulting in reduced performance of shielding in the shielding member. When the shielding performance of the shielding member is reduced, the performance of the electronic components covered by the shielding member may be also reduced, or the performance of other electronic components adjacent to the electronic components covered by the shielding member may decrease. An electronic device may require a shielding member having a structure for reducing deformation due to heat.

According to an embodiment, an electronic device (e.g., the electronic device 200 of FIGS. 4A and 4B) may comprise a printed circuit board (e.g., the printed circuit board 420 of FIGS. 4A and 4B) including a ground pad (e.g., the ground pad 421 of FIGS. 4A and 4B). According to an embodiment, the electronic device may comprise an optical sensor (e.g., the optical sensor 430 of FIGS. 4A and 4B) disposed on the printed circuit board. According to an embodiment, the electronic device may comprise a shielding member (e.g., the shielding member 440 of FIGS. 4A and 4B) covering the optical sensor. According to an embodiment, the shielding member may include a first adhesive layer (e.g., the first adhesive layer 443 of FIG. 4B) attached on the optical sensor and the ground pad. According to an embodiment, the shielding member may include a first shielding layer (e.g., the first shielding layer 444 of FIG. 4B) electrically connected to the ground pad and disposed on the first adhesive layer. According to an embodiment, the shielding member may include a first cover layer (e.g., the first cover layer 445 of FIG. 4B) disposed on the first shielding layer, and including a plurality of first particles (e.g., the plurality of first particles 445a of FIG. 4B) configured to reflect or scatter light, a plurality of second particles (e.g., the plurality of second particles 445b of FIG. 4B) configured to absorb the light, and a binder (e.g., the binder 445c of FIG. 4B) covering the plurality of first particles and the plurality of second particles.

An electronic device according to an embodiment may provide a structure capable of reducing damage to a shielding member due to stress while securing a space in which components in the electronic device are disposed, since a plurality of first particles for reflecting or scattering light and a plurality of second particles for absorbing light are included in a single layer. An electronic device according to an embodiment may provide a structure capable of reducing damage to the shielding member, because a cover layer has relatively high thermostability.

According to an embodiment, the optical sensor may include a light emitting unit (e.g., the light emitting unit 431 of FIGS. 4A and 4B) configured to emit light toward an outside of the electronic device, and a light receiving unit (e.g., the light receiving unit 432 of FIGS. 4A and 4B) configured to receive light reflected from an object of the outside of the electronic device. According to an embodiment, the plurality of first particles may be configured to reflect or scatter light transmitted to the first cover layer by being reflected from inside of the electronic device after being emitted from the light emitting unit. According to an embodiment, the plurality of second particles may be configured to absorb light transmitted to the first cover layer by being reflected from inside of the electronic device after being emitted from the light emitting unit.

An electronic device according to an embodiment may include a plurality of first particles for reflecting or scattering light and a plurality of second particles for absorbing light, in a single layer, and therefore, it is possible to provide a structure for reducing noise of the optical sensor while securing a space in which components in the electronic device are disposed.

According to an embodiment, the electronic device may comprise a housing (e.g., the housing 410 of FIGS. 4A and 4B) accommodating the printed circuit board and the optical sensor, and including at least one opening region (e.g., the at least one opening region 411 of FIGS. 4A and 4B) disposed on the optical sensor. According to an embodiment, the plurality of first particles may be configured to reflect or scatter light that causes noise of the optical sensor by being reflected from inside of the housing after being emitted from the light emitting unit. According to an embodiment, the plurality of second particles may be configured to absorb light that causes noise of the optical sensor by being reflected from inside of the housing after being emitted from the light emitting unit.

Since the electronic device according to an embodiment includes a plurality of first particles for reflecting or scattering light and a plurality of second particles for absorbing light in a single layer, the electronic device may provide a structure for reducing damage to the shielding member due to stress and noise of the optical sensor.

According to an embodiment, the shielding member may further include a first opening (e.g., the first opening 441 of FIGS. 4A and 4B) penetrating the shielding member and disposed on the light emitting unit, and a second opening (e.g., the second opening 442 of FIGS. 4A and 4B) penetrating the shielding member and disposed on the light receiving unit.

The electronic device according to an embodiment may obtain data about an outside of the electronic device by an optical sensor that receives light emitted through the first opening through the second opening.

According to an embodiment, a size of each of the plurality of first particles may be greater than a size of each of the plurality of second particles.

The electronic device according to an embodiment may provide a structure capable of reducing the surface reflectance of the shielding member, owing to the size of the second particle being smaller than the size of the first particle.

According to an embodiment, the plurality of first particles may include metal particles configured to reflect or scatter the light.

The electronic device according to an embodiment may provide a structure capable of reflecting or scattering light causing noise of the optical sensor by the first particles including metal particles.

According to an embodiment, the plurality of second particles may include carbon black.

The electronic device according to an embodiment may provide a structure capable of absorbing light causing noise of the optical sensor, by the second particles including carbon black.

According to an embodiment, the binder may include polyurethane (PU) defining one layer together with the plurality of first particles and the plurality of second particles.

The electronic device according to an embodiment may provide a structure capable of reducing damage to the shielding member due to stress while securing a space in which components in the electronic device are disposed, by the binder including the polyurethane defining one layer together with the first particle and the second particle.

According to an embodiment, the binder may have a light transmittance greater than a light transmittance of each of the plurality of first particles and the plurality of second particles.

According to an embodiment, the first shielding layer may include at least one of nanofiber and metal, electrically connected to the ground pad.

An electronic device according to an embodiment may provide a structure capable of reducing noise of the optical sensor, owing to a conductive material included in a shielding layer.

According to an embodiment, the first adhesive layer may include a conductive material electrically connecting the ground pad and the first shielding layer.

The electronic device according to an embodiment may provide a structure capable of electrically connecting the shielding layer and the ground pad of the printed circuit board, owing to the adhesive layer including a conductive material.

According to an embodiment, the first shielding layer may include a plurality of irregularities (e.g., a plurality of irregularities 445a-1 of FIG. 4B) disposed on an outer surface of the first cover layer and defined by the plurality of first particles.

The electronic device according to an embodiment may provide a structure capable of reducing noise of the optical sensor, because light is diffusely reflected by a plurality of irregularities formed on the outer surface of the cover layer.

According to an embodiment, a weight ratio of the binder to a total weight of the first cover layer may be preferably 10% to 40%. According to an embodiment, a weight ratio of the plurality of first particles to the total weight of the first cover layer may be preferably 12% to 45%. According to an embodiment, a weight ratio of the plurality of second particles to the total weight of the first cover layer may be preferably 30% to 72%.

According to an embodiment, the shielding member may further include a second adhesive layer (e.g., the second adhesive layer 446 of FIG. 5) distinct from the first adhesive layer and disposed on the first shielding layer. According to an embodiment, the shielding member may further include a second shielding layer (e.g., the second shielding layer 447 of FIG. 5) distinct from the first shielding layer and disposed on the second adhesive layer. According to an embodiment, the first cover layer may be disposed on the second shielding layer.

The shielding member according to an embodiment may provide a structure in which the performance of the shielding member is increased while reducing damage caused by an impact from the outside of the shielding member, by the second adhesive layer and the second shielding layer interposed between the first cover layer and the first shielding layer.

According to an embodiment, the first cover layer may be spaced apart from the first shielding layer. According to an embodiment, the shielding member may further include a second cover layer (e.g., the second cover layer 448 of FIG. 6) distinct from the first cover layer and disposed on the first shielding layer. According to an embodiment, the shielding member may further include a second adhesive layer (e.g., the second adhesive layer 446 of FIG. 6) distinct from the first adhesive layer and disposed on the second cover layer. According to an embodiment, the shielding member may further include a second shielding layer (e.g., the second shielding layer 447 of FIG. 6) distinct from the first shielding layer and interposed between the second adhesive layer and the first cover layer.

The shielding member according to an embodiment may provide a structure for reducing damage caused by an impact from the outside of the shielding member, by the second cover layer, the second adhesive layer, and the second shielding layer, interposed between the first cover layer and the first shielding layer.

According to an embodiment, an electronic device (e.g., the electronic device 200 of FIGS. 4A and 4B) may comprise a housing (e.g., the housing 410 of FIGS. 4A and 4B) including one surface (e.g., one surface 410a of FIG. 4A) supporting a display (e.g., the display 201 of FIGS. 2 and 3) and another surface (e.g., the other surface 410b of FIGS. 4A and 4B) opposite to the one surface. According to an embodiment, the electronic device may comprise a printed circuit board (e.g., the printed circuit board 420 of FIGS. 4A and 4B) including a ground pad (e.g., the ground pad 421 of FIGS. 4A and 4B) and disposed in the housing. According to an embodiment, the electronic device may comprise an optical sensor (e.g., the optical sensor 430 of FIGS. 4A and 4B) disposed on the printed circuit board and including a light emitting unit (e.g., the light emitting unit 431 of FIGS. 4A and 4B) configured to emit light toward the another surface of the housing, and a light receiving unit (e.g., the light receiving unit 432 of FIGS. 4A and 4B) configured to receive light emitted from the light emitting unit and reflected from an object of an outside of the electronic device. According to an embodiment, the electronic device may comprise a shielding member (e.g., the shielding member 440 of FIGS. 4A and 4B) covering the optical sensor and at least a portion of the PCB. According to an embodiment, the shielding member may comprise a first adhesive layer (e.g., the first adhesive layer 443 of FIG. 4B) attached on the optical sensor and the ground pad. According to an embodiment, the shielding member may comprise a first shielding layer (e.g., the first shielding layer 444 of FIG. 4B) electrically connected to the ground pad and disposed on the first adhesive layer. According to an embodiment, the shielding member may comprise a first cover layer (e.g., the first cover layer 445 of FIG. 4B) disposed on the first shielding layer and including a plurality of first particles (e.g., the plurality of first particles 445a of FIG. 4B) configured to reflect or scatter light reflected from an inside of the housing after being emitted from the light emitting unit, a plurality of second particles (e.g., the plurality of second particles 445b of FIG. 4B) configured to absorb the light reflected from the inside of the housing after being emitted from the light emitting unit, and a binder (e.g., the binder of FIG. 4B) defining a mixture together with the plurality of first particles and the plurality of second particles by covering the plurality of first particles and the plurality of second particles.

The electronic device according to an embodiment includes a plurality of first particles for reflecting or scattering light and a plurality of second particles for absorbing light, in a single layer, and therefore, it is possible to provide a structure capable of reducing damage to the shielding member due to stress while securing a space in which components in the electronic device are disposed. The electronic device according to an embodiment may provide a structure capable of reducing damage to the shielding member because the cover layer has relatively high thermostability. According to an embodiment, the housing may further comprise at least one opening region (e.g., at least one opening region 411 of FIGS. 4A and 4B) penetrating the housing and corresponding to the optical sensor.

Since a plurality of first particles for reflecting or scattering light and a plurality of second particles for absorbing light are included in one layer, the electronic device according to an embodiment may provide a structure for reducing damage to the shielding member due to stress and noise of the optical sensor.

According to an embodiment, the shielding member may further comprise a first opening (e.g., the first opening 441 of FIGS. 4A and 4B) penetrating the shielding member and disposed on the light emitting unit. According to an embodiment, the shielding member may further comprise a second opening (e.g., the second opening 442 of FIGS. 4A and 4B) penetrating the shielding member and disposed on the light receiving unit.

The electronic device according to an embodiment may obtain data about the outside of the electronic device, by an optical sensor that receives light emitted through the first opening, through the second opening.

According to an embodiment, a size of each of the plurality of first particles may be greater than a size of each of the plurality of second particles.

The electronic device according to an embodiment may provide a structure capable of reducing a surface reflectance of the shielding member owing to the size of the second particle being smaller than the size of the first particle.

According to an embodiment, the binder may have a light transmittance greater than a light transmittance of each of the plurality of first particles and the plurality of second particles.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment, the electronic devices are not limited to those described above.

It should be appreciated that various embodiments and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may be interchangeably used with other terms, for example, "logic," "logic block,", "unit", "part,", "portion" or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a printed circuit board (PCB) including a ground pad;
   an optical sensor disposed on the PCB; and
   a shielding member covering the optical sensor,
   wherein the shielding member includes:
   a first adhesive layer attached on the optical sensor and the ground pad,
   a first shielding layer electrically connected to the ground pad and disposed on the first adhesive layer, and
   a first cover layer disposed on the first shielding layer, and including a plurality of first particles configured to reflect or scatter light, a plurality of second particles configured to absorb the light, and a binder covering the plurality of first particles and the plurality of second particles.

2. The electronic device of claim 1,
   wherein the optical sensor includes:
   a light emitting unit configured to emit light toward an outside of the electronic device, and
   a light receiving unit configured to receive light reflected from an object of the outside of the electronic device,
   wherein the plurality of first particles are configured to reflect or scatter light transmitted to the first cover layer by being reflected inside of the electronic device after being emitted from the light emitting unit, and
   wherein the plurality of second particles are configured to absorb light transmitted to the first cover layer by being reflected inside of the electronic device after being emitted from the light emitting unit.

3. The electronic device of claim 2, further comprising:
   a housing accommodating the PCB and the optical sensor, and including at least one opening region disposed on the optical sensor,
   wherein the plurality of first particles are configured to reflect or scatter light that causes noise of the optical sensor by being reflected inside of the housing after being emitted from the light emitting unit, and
   wherein the plurality of second particles are configured to absorb light that causes noise of the optical sensor by being reflected inside of the housing after being emitted from the light emitting unit.

4. The electronic device of claim 2, wherein the shielding member further includes:
   a first opening penetrating the shielding member and disposed on the light emitting unit; and
   a second opening penetrating the shielding member and disposed on the light receiving unit.

5. The electronic device of claim 1, wherein a size of each of the plurality of second particles is smaller than a size of each of the plurality of first particles.

6. The electronic device of claim 1, wherein the plurality of first particles include metal particles configured to reflect or scatter the light.

7. The electronic device of claim 1, wherein the plurality of second particles includes carbon black.

8. The electronic device of claim 1, wherein the binder includes polyurethane (PU) defining one layer together with the plurality of first particles and the plurality of second particles.

9. The electronic device of claim 1, wherein the binder has a light transmittance higher than a light transmittance of each of the plurality of first particles and the plurality of second particles.

10. The electronic device of claim 1, wherein the first shielding layer includes at least one of nanofiber and metal, electrically connected to the ground pad.

11. The electronic device of claim 1, wherein the first adhesive layer includes a conductive material electrically connecting the ground pad and the first shielding layer.

12. The electronic device of claim 1, wherein the first shielding layer includes a plurality of irregularities disposed on an outer surface of the first cover layer and defined by the plurality of first particles.

13. The electronic device of claim 1,
    wherein a weight ratio of the binder to a total weight of the first cover layer is 10% to 40%,
    wherein a weight ratio of the plurality of first particles to the total weight of the first cover layer is 12% to 45%, and
    wherein a weight ratio of the plurality of second particles to the total weight of the first cover layer is 30% to 72%.

14. The electronic device of claim 1,
    wherein the shielding member further includes:
    a second adhesive layer distinct from the first adhesive layer and disposed on the first shielding layer, and
    a second shielding layer distinct from the first shielding layer and disposed on the second adhesive layer, and
    wherein the first cover layer is disposed on the second shielding layer.

15. The electronic device of claim 1,
    wherein the first cover layer is spaced apart from the first shielding layer, and
    wherein the shielding member further includes:
    a second cover layer distinct from the first cover layer and disposed on the first shielding layer,
    a second adhesive layer distinct from the first adhesive layer and disposed on the second cover layer, and
    a second shielding layer distinct from the first shielding layer and interposed between the second adhesive layer and the first cover layer.

16. An electronic device comprising:
    a housing including one surface supporting a display and another surface opposite to the one surface;
    a printed circuit board (PCB) including a ground pad and disposed in the housing;
    an optical sensor disposed on the PCB, and including:
    a light emitting unit configured to emit light toward the another surface of the housing, and
    a light receiving unit configured to receive light emitted from the light emitting unit and reflected from an object of an outside of the electronic device; and
    a shielding member covering the optical sensor and at least a portion of the PCB,
    wherein the shielding member includes:
    a first adhesive layer attached on the optical sensor and the ground pad,
    a first shielding layer electrically connected to the ground pad and disposed on the first adhesive layer, and
    a first cover layer disposed on the first shielding layer, and including a plurality of first particles configured to reflect or scatter light reflected inside of the housing after being emitted from the light emitting unit, a plurality of second particles configured to absorb the light reflected inside of the housing after being emitted from the light emitting unit, and a binder defining a mixture together with the plurality of first particles and the plurality of second particles by covering the plurality of first particles and the plurality of second particles.

17. The electronic device of claim 16, wherein the housing further includes at least one opening region penetrating the housing and corresponding to the optical sensor.

18. The electronic device of claim 16, wherein the shielding member further includes:
   a first opening penetrating the shielding member and disposed on the light emitting unit; and
   a second opening penetrating the shielding member and disposed on the light receiving unit.

19. The electronic device of claim 16, wherein a size of each of the plurality of second particles is smaller than a size of each of the plurality of first particles.

20. The electronic device of claim 16, wherein the binder has a light transmittance higher than a light transmittance of each of the plurality of first particles and the plurality of second particles.

* * * * *